United States Patent
Nojima (10) Patent No.: US 11,290,088 B2
(45) Date of Patent: Mar. 29, 2022

(54) DRIVERS FOR PARALLELED SEMICONDUCTOR SWITCHES

(71) Applicant: Eaton Intelligent Power Limited, Dublin (IE)

(72) Inventor: Geraldo Nojima, Fort Mill, SC (US)

(73) Assignee: Eaton Intelligent Power Limited

( * ) Notice: Subject to any disclaimer, the term of this patent is extended or adjusted under 35 U.S.C. 154(b) by 89 days.

(21) Appl. No.: 16/795,261

(22) Filed: Feb. 19, 2020

(65) Prior Publication Data

US 2021/0257996 A1   Aug. 19, 2021

(51) Int. Cl.
*H03K 3/011*   (2006.01)

(52) U.S. Cl.
CPC .................... *H03K 3/011* (2013.01)

(58) Field of Classification Search
CPC .................................................. H02M 1/088
USPC ................. 327/108–112, 427, 434, 437, 379
See application file for complete search history.

(56) References Cited

U.S. PATENT DOCUMENTS

| | | | | |
|---|---|---|---|---|
| 5,909,108 A * | 6/1999 | He | ...................... | H02M 3/1584 323/222 |
| 7,372,432 B2 * | 5/2008 | Lee | ........................ | G09G 3/296 315/169.4 |
| 7,737,666 B2 * | 6/2010 | Sutardja | .............. | H02M 3/1588 323/222 |
| 8,351,231 B2 * | 1/2013 | Tagome | ................ | H02M 1/088 326/91 |
| 9,692,394 B1 * | 6/2017 | Agrawal | ........... | H03K 19/0005 |
| 2003/0038615 A1 * | 2/2003 | Elbanhawy | ........ | H03K 17/6871 323/282 |
| 2004/0252430 A1 * | 12/2004 | Oumaru | ............. | H03K 17/0828 361/84 |
| 2012/0280728 A1 * | 11/2012 | Hussein | ............... | H03K 17/168 327/155 |
| 2013/0009675 A1 * | 1/2013 | Chiba | ..................... | H02M 1/08 327/109 |
| 2013/0082769 A1 * | 4/2013 | Kwon | .................. | H03K 5/1565 327/581 |
| 2016/0233858 A1 * | 8/2016 | Wasekura | ........... | H01L 29/7395 |
| 2019/0222108 A1 * | 7/2019 | Xu | ........................ | H02M 1/088 |

FOREIGN PATENT DOCUMENTS

JP           2019004558           1/2019

OTHER PUBLICATIONS

International Search Report and Written Opinion; PCT/EP2021/025059; dated May 27, 2021; 9 pages).

* cited by examiner

*Primary Examiner* — Tomi Skibinski
(74) *Attorney, Agent, or Firm* — Stanek Lemon Crouse & Meeks, P.A.

(57) ABSTRACT

An apparatus includes a plurality of parallel-connected semiconductor switches (e.g., silicon carbide (SiC) metal oxide semiconductor field effect transistors (MOSFETs) or other wide-bandgap semiconductor switches) and a plurality of driver circuits having outputs configured to be coupled to control terminals of respective ones of the plurality of semiconductor switches and configured to drive the parallel-connected semiconductor switches responsive to a common switch state control signal. The driver circuits may have respective different power supplies, which may be adjustable. Respective output resistors may couple respective ones of the driver circuits to respective ones of the semiconductor switches. The output resistors may be adjustable.

18 Claims, 6 Drawing Sheets

DRIVERS FOR PARALLELED SEMICONDUCTOR SWITCHES

STATEMENT OF GOVERNMENT SUPPORT

This invention was made with Government support under Contract #DE-EE0007253 awarded by the United States Department of Energy. The Government has certain rights in the invention.

BACKGROUND

The inventive subject matter relates to electrical power apparatus and methods and, more particularly, to driver circuits for power semiconductor switches.

Semiconductor switches, such as insulated gate bipolar transistors (IGBTs) and power metal-oxide-semiconductor field-effect transistors (MOSFETs), are used in a variety of different types of electrical power applications, such as in rectifiers, inverters, motor drives and the like. Solid state circuit breakers incorporating such semiconductor switches have also been developed, with the semiconductor switches being used to replace the electromechanical switches traditionally used in such devices. In such applications, semiconductor switches offer advantages of speed and resistance to environmental degradation.

In some applications, it is desirable to operate multiple semiconductor switches in parallel in order to increase current carrying capacity. However, relatively small disparities in device parameters, such as turn-on resistance and threshold voltage, can lead to nonuniform current distribution among the paralleled devices. Such current maldistribution can lead to device overload and failure. Such problems can be particularly acute for wide bandgap semiconductor switches, such as silicon carbide (SiC) power transistors, which may be operated at switching frequencies and/or voltage levels that are significantly greater than those used for conventional silicon devices.

SUMMARY

Some embodiments of the inventive subject matter provide an apparatus including a plurality of parallel-connected semiconductor switches (e.g., silicon carbide (SiC) metal oxide semiconductor field effect transistors (MOSFETs) or other wide-bandgap semiconductor switches) and a plurality of driver circuits having outputs configured to be coupled to control terminals of respective ones of the plurality of semiconductor switches and configured to drive the parallel-connected semiconductor switches responsive to a common switch state control signal. The driver circuits may have respective different power supplies, which may be adjustable. Respective output resistors may couple respective ones of the driver circuits to respective ones of the semiconductor switches. The output resistors may be adjustable.

In some embodiments, the plurality of driver circuits may include a plurality of single-stage amplifier circuits having outputs configured to be coupled to the control terminals of respective ones of the semiconductor switches. The apparatus may further include a pre-driver circuit having an output coupled in common to control terminals of the amplifier circuits. The amplifier circuits may include respective push-pull amplifier circuits, such as totem-pole circuits.

Further embodiments provide an apparatus including a plurality of parallel-connected wide-bandgap semiconductor switches and a plurality of totem-pole amplifier circuits having outputs configured to be coupled to control terminals of respective ones of the semiconductor switches and configured to operate responsive to a common drive signal. The amplifier circuits may have respective different power supplies. The apparatus may further include respective output resistors coupling respective ones of the amplifier circuits to respective ones of the semiconductor switches. The semiconductor switches may include respective SiC MOSFETs.

Still further embodiments provide an apparatus including a plurality of totem-pole circuits configured to be coupled to control terminals of respective ones of a plurality of semiconductor switches and a pre-driver circuit having an output coupled in common to control terminals of the totem-pole circuits. The totem-pole circuits may have respective different power supplies. The apparatus may also include respective output resistors coupling respective ones of the totem-pole circuits to respective ones of the semiconductor switches. The apparatus may further include the plurality of semiconductor switches, wherein the semiconductor switches are connected in parallel.

DETAILED DESCRIPTION

Specific exemplary embodiments of the inventive subject matter now will be described with reference to the accompanying drawings. This inventive subject matter may, however, be embodied in many different forms and should not be construed as limited to the embodiments set forth herein; rather, these embodiments are provided so that this disclosure will be thorough and complete, and will fully convey the scope of the inventive subject matter to those skilled in the art. In the drawings, like numbers refer to like items. It will be understood that when an item is referred to as being "connected" or "coupled" to another item, it can be directly connected or coupled to the other item or intervening items may be present. As used herein the term "and/or" includes any and all combinations of one or more of the associated listed items.

The terminology used herein is for the purpose of describing particular embodiments only and is not intended to be limiting of the inventive subject matter. As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, items, and/or components, but do not preclude the presence or addition of one or more other features, integers, steps, operations, items, components, and/or groups thereof.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the specification and the relevant art and will not be interpreted in an idealized or overly formal sense unless expressly so defined herein.

Figure 1:
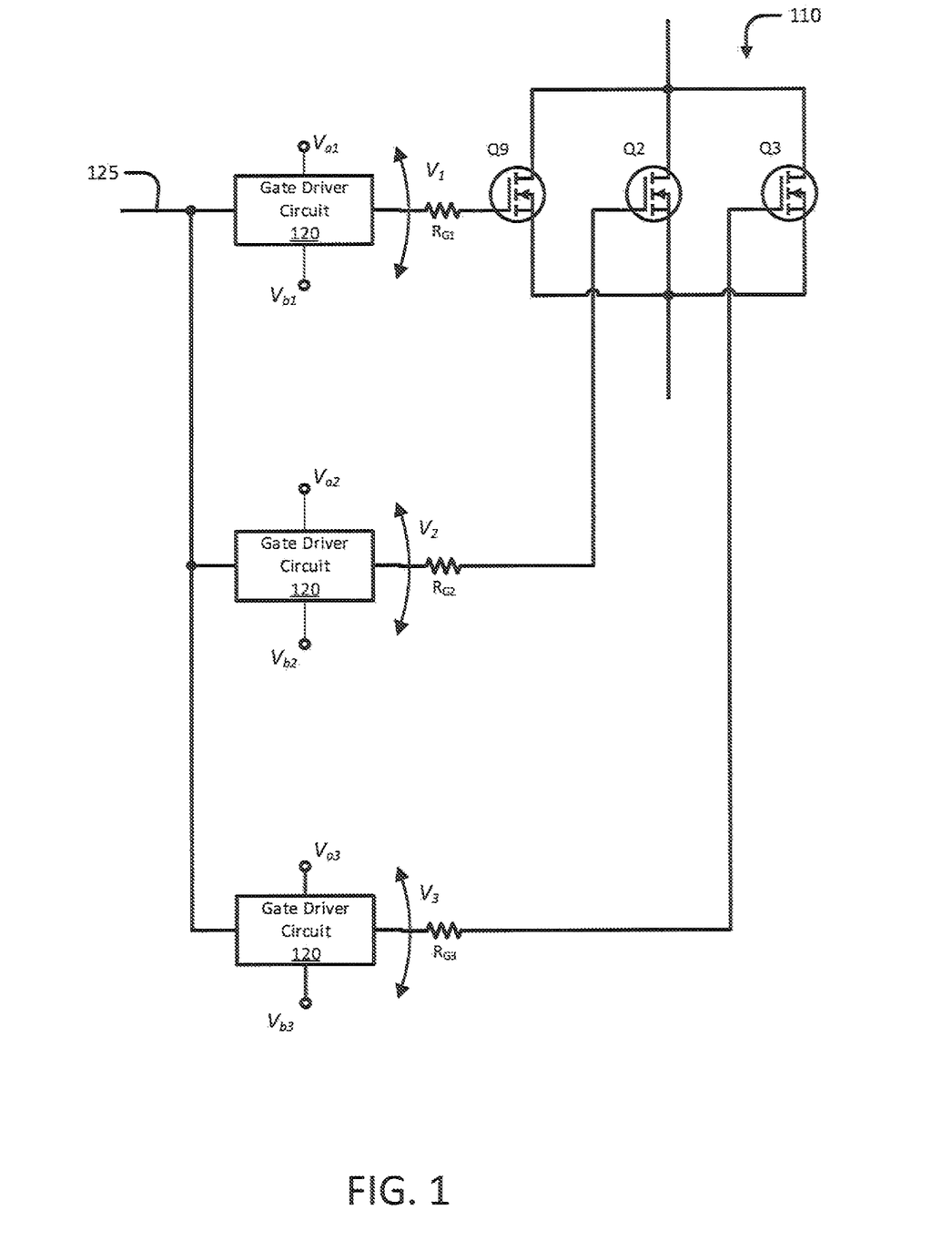
FIG. 1 is a schematic diagram of a driver circuit for parallel-connected semiconductor switching devices according to some embodiments.

FIG. 1 illustrates driver circuitry for driving parallel connected transistors Q1, Q2, Q3 according to some embodiments of the inventive subject matter. The transistors Q1, Q2, Q3 may be, for example, SiC power MOSFETs or other wide bandgap semiconductor switching devices. The transistors Q1, Q2, Q3 may correspond to, for example, individually packaged transistors or may correspond to respective groups of parallel-connected transistors, such as groups of transistors in respective multi-transistor modules.

The transistors Q1, Q2, Q3 are driven by respective gate driver circuits 120 responsive to a common switch state control signal 125, which represents a command to place the transistors Q1, Q2, Q3 into a selected one of an "on" state or an "off" state. The gate driver circuits 120 are connected to power supply nodes $V_{a1}V_{b1}$, $V_{a2}V_{b2}$, $V_{a3}V_{b3}$, such that different power supply voltages $V_1$, $V_2$, $V_3$ may be applied to the respective totem-pole circuits 220. Respective ones of the gate driver circuits 120 are coupled to gate terminals of the transistors Q1, Q2, Q3 by respective output resistors $R_{G1}$, $R_{G2}$, $R_{G3}$. According to some aspects, driving parallel-connected semiconductor switches using gate driver circuits with separate and independent power supply voltages $V_1$, $V_2$, $V_3$ and/or output resistors $R_{G1}$, $R_{G2}$, $R_{G3}$ can provide one or more degrees of freedom for controlling signals applied to the gate terminals of the MOSFETs Q1, Q2, Q3. This control can be used to achieve more uniform switching of the parallel-connected transistors Q1, Q2 Q3, which may be particularly advantageous in applications wherein the MOSFETs Q1, Q2, Q3 are, for example, SiC MOSFETs that are being operated at very high switching frequencies and power levels that can exacerbate current sharing problems associated with parameter mismatches between the devices.

Figure 2:
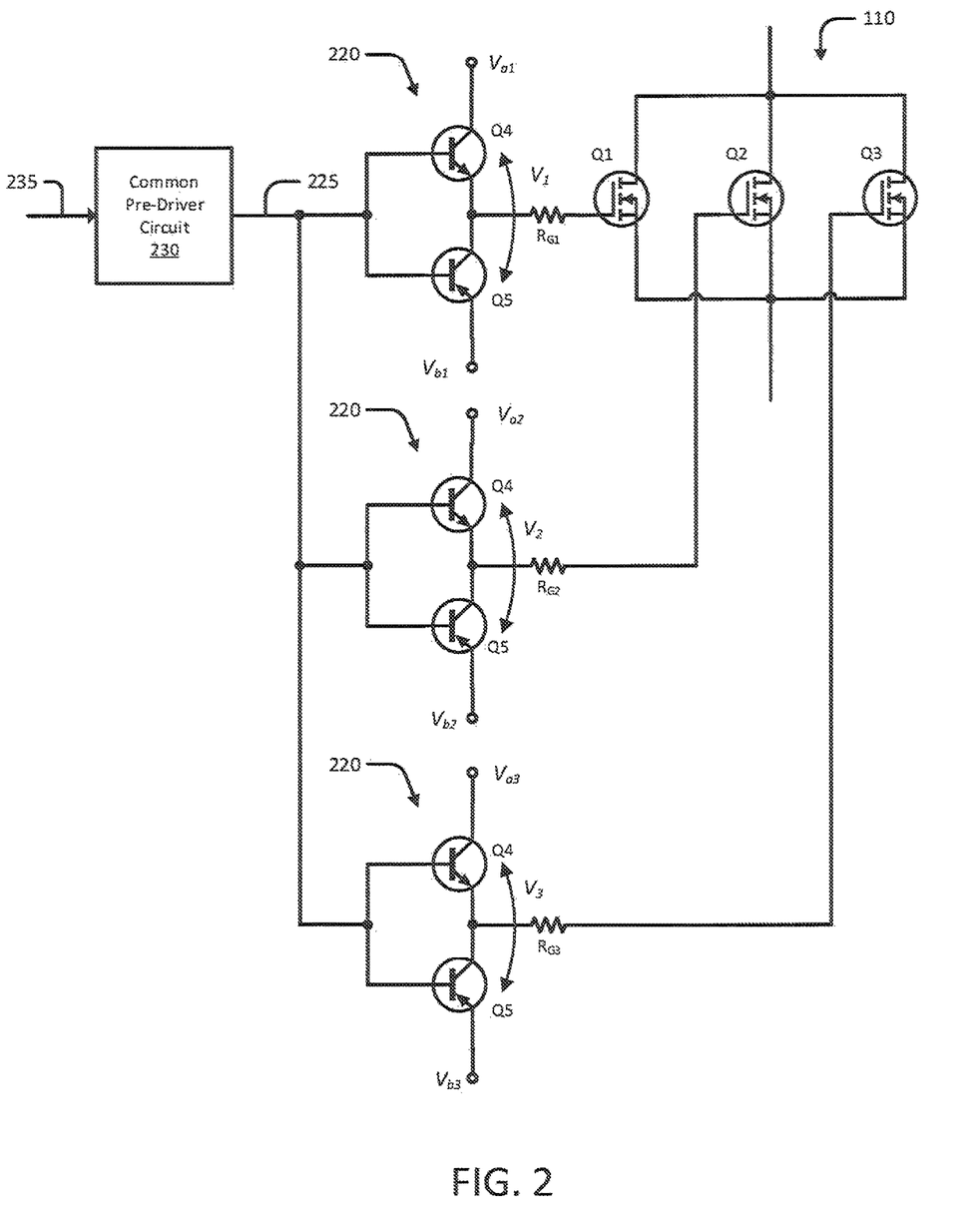
FIG. 2 is a schematic diagram of a driver circuit for parallel-connected semiconductor switching devices according to further embodiments.

FIG. 2 illustrates driver circuitry for parallel-connected MOSFETs Q1, Q2, Q3 (e.g., SiC power MOSFETs or other wide bandgap semiconductor switching devices) according to further embodiments. The transistors Q1, Q2, Q3 shown in FIG. 2 may correspond to, for example, individually packaged transistors or may correspond to respective groups of parallel-connected transistors, such as groups of transistors in respective multi-transistor modules. The transistors Q1, Q2, Q3 are driven by respective totem-pole push-pull circuits 220. Responsive to a first switch state control signal 235, which represents a command to place the transistors Q1, Q2, Q3 into a selected one of an "on" state or an "off" state, a pre-driver circuit 230 generates a corresponding second switch state control signal 225, which exhibits state transitions that correlate with the state transitions of the first switch state control signal 235 and is applied in common to the totem-pole circuits 220. The first switch state control signal 235 may be generated, for example, by a control circuit for a converter or other apparatus which includes the transistors Q1, Q2, Q3.

As further shown, the totem pole circuits 220 are connected to the power supply nodes $V_{a1}/V_{b1}$, $V_{a2}/V_{b2}$, $V_{a3}/V_{b3}$ such that different power supply voltages $V_1$, $V_2$, $V_3$ may be applied to the respective totem-pole circuits 220. Respective ones of the totem-pole circuits 220 are coupled to gate terminals of the transistors Q1, Q2, Q3 by respective output resistors $R_{G1}$, $R_{G2}$, $R_{G3}$. Along lines discussed above with reference to FIG. 1, the use of separate totem-pole circuits with separate and independent power supply voltages $V_1$, $V_2$, $V_3$ and/or output resistors $R_{G1}$, $R_{G2}$, $R_{G3}$ can provide mechanisms for controlling signals applied to the gate terminals of the MOSFETs Q1, Q2, Q3 to achieve more uniform switching of the parallel-connected transistors Q1, Q2, Q3.

In some embodiments, the power supply voltages $V_1$, $V_2$, $V_3$ and/or the output resistors $R_{G1}$, $R_{G2}$, $R_{G3}$ may be set and/or selected at time of fabrication of the gate drive circuitry based, for example, on measured parameters of the associated transistors Q1, Q2, Q3. For example, the "on" state resistance characteristics of the transistors Q1, Q2, Q3 may be determined from manufacturer-supplied data and/or tests. The power supply voltages $V_1$, $V_2$, $V_3$ may be set based on this data such that the transistor Q1, Q2, Q3 exhibit, for example, substantially the same "on" state voltage. Similarly, respective threshold voltage characteristics for the transistors Q1, Q2, Q3 may be determined from manufacturer-supplied data and/or tests, and the output resistors $R_{G1}$, $R_{G2}$, $R_{G3}$ may be set or selected based on this data such that, for example, each of the transistors Q1, Q2, Q3 turn on at substantially the same time.

Figure 3:
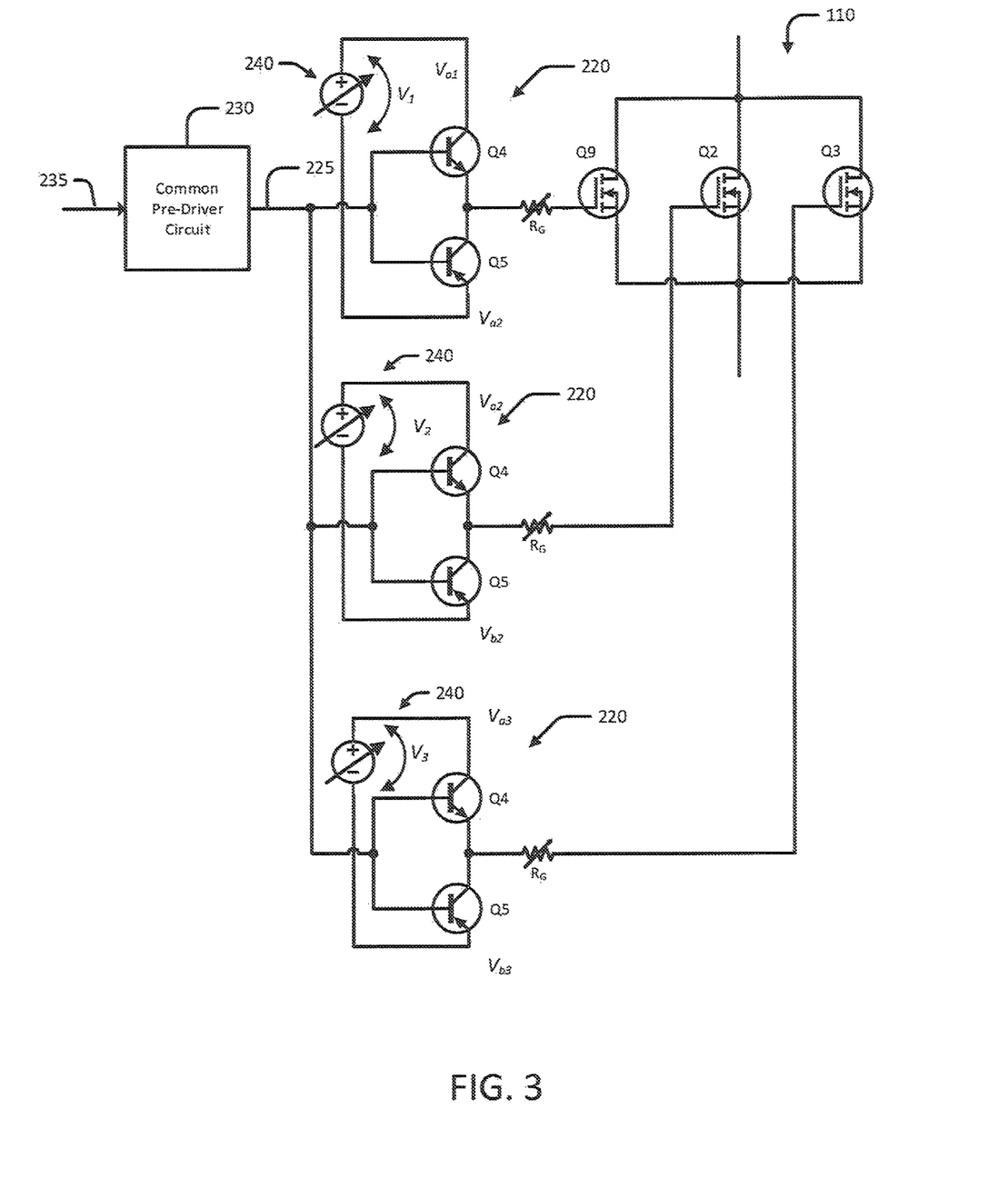
FIG. 3 is a schematic diagram of a driver circuit for a semiconductor switch according to further embodiments.

According to further embodiments, a driver circuit may be configured to enable adjustment of power supply voltage and/or output resistance to provide desired performance. Referring to FIG. 3, for example, driver circuitry may include a plurality of totem-pole circuits 220 that are configured to drive respective ones of parallel-connected MOSFETs Q1, Q2, Q3. Respective ones of the totem-pole circuits 220 are coupled to respective adjustable power supplies 240a, 240b, 240c, which are configured to vary the power supply voltages $V_1$, $V_2$, $V_3$ applied to the totem-pole circuits 220 responsive to a control input, such as a calibration input. Respective ones of the totem-pole circuits 220 are coupled to the respective MOSFETs Q1, Q2, Q3 by respective adjustable output resistors $R_G$, which provide resistances that are adjustable responsive to a control input.

Figure 4:
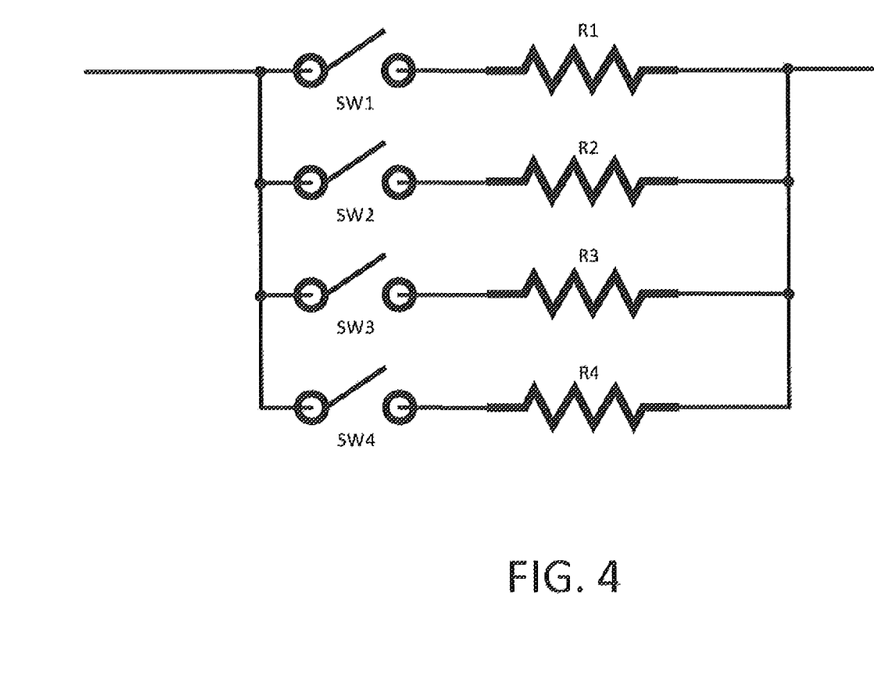
FIG. 4 is a schematic diagram illustrating an example of a variable resistor circuit according to some embodiments.

An example of a variable resistor circuit 400 that might be used for the output resistors $R_G$ in such an application is illustrated in FIG. 4. The variable resistor circuit includes a plurality of resistors R1, R2, R3, R4 that may be selectively connected in parallel by a plurality of switches SW1, SW3, SW3, SW4 to provide a variety of different resistances. It will be appreciated that the circuitry shown in FIG. 4 is provided for purposes of illustration, and that other circuit arrangements may be used to provide a variable resistance.

Figure 5:
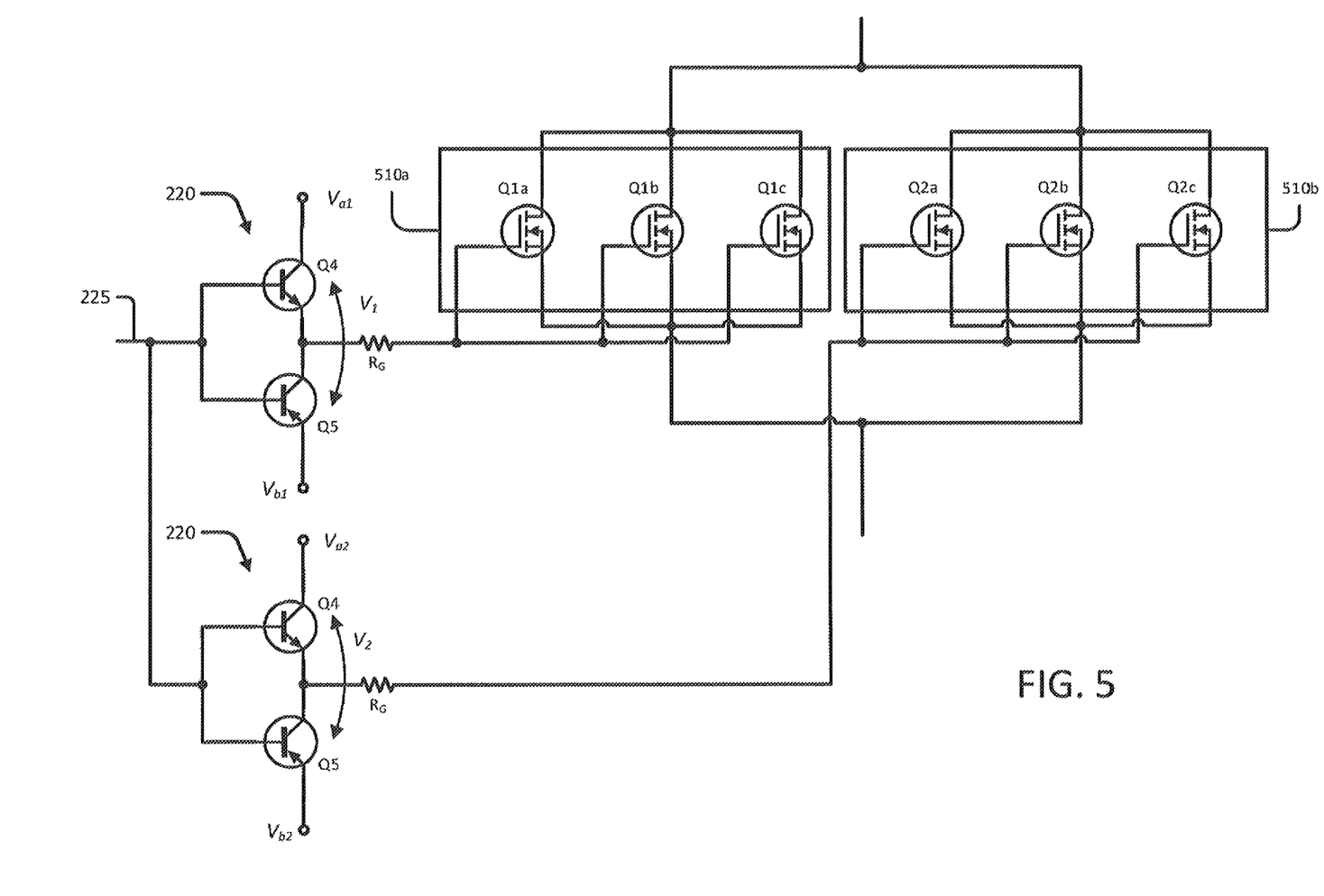
FIG. 5 is a schematic diagram illustrating a driver circuit for parallel-connected multi-transistor modules according to some embodiments.

As noted above, driver circuitry along the lines described with reference to FIGS. 1-4 may be used in applications involving multi-transistor modules. For example, FIG. 5 illustrates driver circuitry for driving MOSFETs Q1a-c, Q2a-c of respective multi-transistor modules 510a, 510b that are connected in parallel. At a given one of the modules 510a, 510b, the MOSFETs Q1a-c, Q2a-c may be connected in parallel, either internally within the module or by relatively short connections between terminals of the transistors accessible from the exterior of the module. Within a given one of the modules 510a, 510b, the transistors may be sufficiently well-matched and/or share a common thermal environment such that their on-state resistance and threshold voltages remain sufficiently uniform to be driven by a common drive (e.g., gate) signal.

To allow for more uniform performance among the modules 510a, 510b, however, respective totem-pole push-pull circuits 520 may be used to drive the respective modules 510a, 510b, along the lines described above with reference to FIGS. 1-4. As shown, the totem-pole circuits 520 may have respective different power supply voltages $V_1$, $V_2$ applied thereto, and may be connected to respective ones of the transistor modules 510a, 510b by respective different output resistors $R_{G1}$, $R_{G2}$. A common switch state control signal 525 is applied to the base terminals of the transistors Q4, Q5 of the totem-pole circuits 520 so that the states of the transistors of the modules 510a, 510b change in unison. Along lines discussed above with respect to FIGS. 1-3, the power supply voltages $V_1$, $V_2$ and the output resistors $R_{G1}$, $R_{G2}$ may be selected and/or adjusted to achieve more uniform on-state resistance and threshold voltage performance among the modules 510a, 510b. In this manner, more uniform current sharing among the modules 510a, 510b may be achieved.

Figure 6:
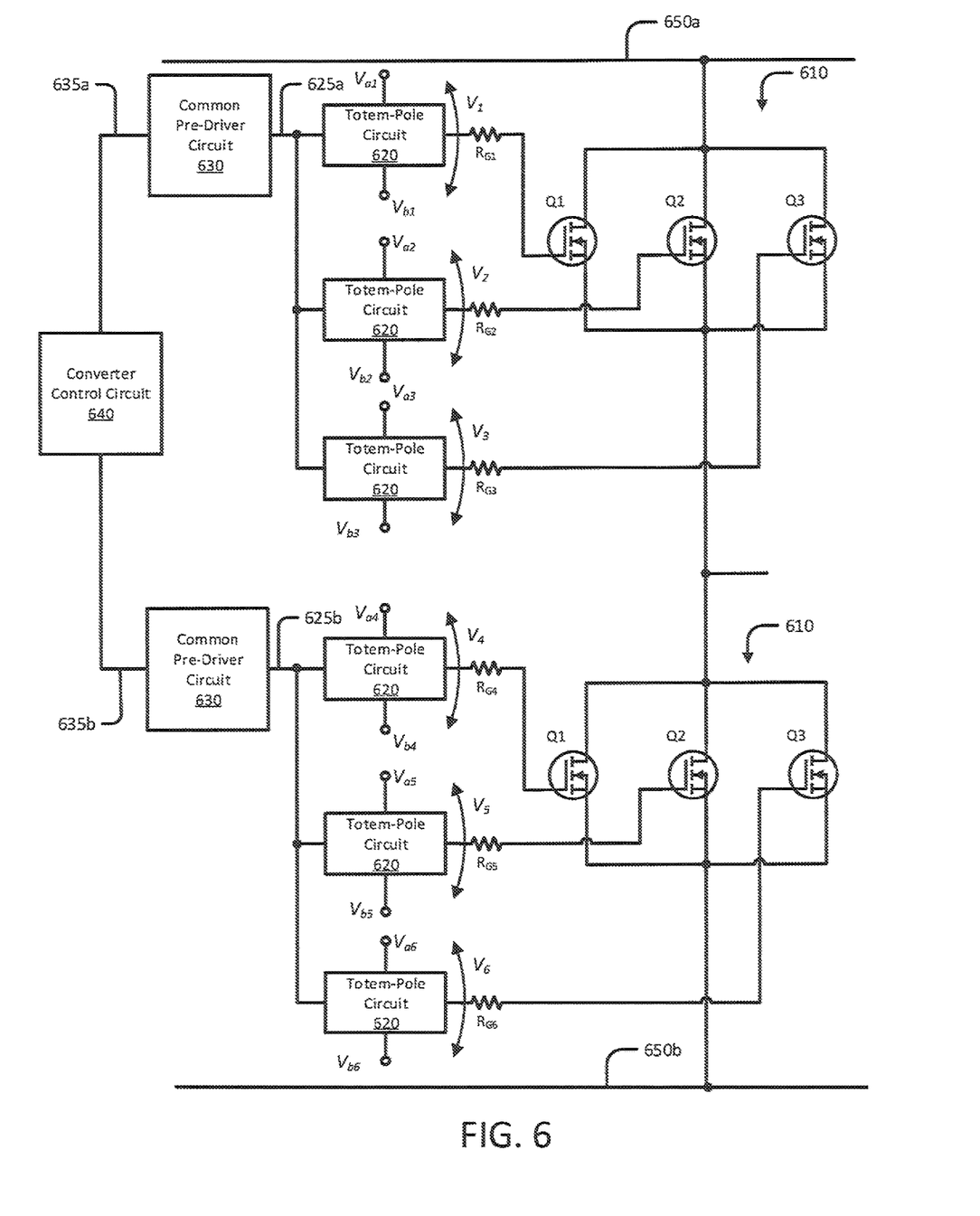
FIG. 6 is a schematic diagram illustrating a converter using a driver circuit according to some embodiments.

Drive circuitry according to embodiments of the inventive subject matter may be used in any of a variety of different applications. FIG. 6 illustrates a converter circuit, in particular, a bridge circuit that may be used in a rectifier and/or inverter and that includes series connected groups 110 of parallel-connected MOSFETs Q1, Q2, Q3 and an inductor L. A converter control circuit 640 is configured to generate respective first switch state control signals 635a, 635b based, for example, on current, voltage and/or other parameters associated with operation of the converter circuit. States of the first switch state control signals 635a, 635b may correspond to "on" and "off" states of the associated sets of MOSFETs Q1, Q2, Q3 commanded by the converter control circuit 640. The first switch state control signals 635a, 635b are provided to respective pre-driver circuits 630, which generate corresponding second switch state control signals 625a, 625b that drive respective groups of totem-pole circuits 620 in unison. The totem power circuits 620 drive respective ones of the MOSFETs Q1, Q2, Q3. Along the lines discussed above, the totem-pole circuits 620 may be coupled to power supply nodes $V_{a1}/V_{b1}$, $V_{a2}/V_{b2}$, $V_{a3}/V_{b3}$, $V_{a4}/V_{b4}$, $V_{a5}/V_{b5}$, $V_{a6}/V_{b6}$ such that the power supply voltages $V_1$, $V_2$, $V_3$, $V_4$, $V_5$, $V_6$ applied thereto are independently selectable or adjustable. The totem-pole circuits 620 may also be coupled to the MOSFETs Q1, Q2, Q3 by respective output resistors $R_{G1}$, $R_{G2}$, $R_{G3}$, $R_{G4}$, $R_{G5}$, $R_{G6}$ that can be independently selected or adjusted.

The drawings and specification, there have been disclosed exemplary embodiments of the inventive subject matter. Although specific terms are employed, they are used in a generic and descriptive sense only and not for purposes of limitation, the scope of the inventive subject matter being defined by the following claims.

That which is claimed:

1. An apparatus comprising:
a plurality of parallel-connected semiconductor switches; and
a plurality of driver circuits having respective different power supplies and outputs configured to be coupled to control terminals of respective ones of the plurality of semiconductor switches and configured to drive the parallel-connected semiconductor switches responsive to a common switch state control signal such that state transitions of the parallel-connected semiconductor switches are aligned.

2. The apparatus of claim 1, wherein the power supplies are adjustable.

3. The apparatus of claim 1, further comprising respective output resistors coupling respective ones of the driver circuits to respective ones of the semiconductor switches.

4. The apparatus of claim 3, wherein the output resistors are adjustable.

5. The apparatus of claim 1, wherein the outputs of the driver circuits are configured to be coupled to the control terminals of the respective semiconductor switches by respective output resistors.

6. The apparatus of claim 5, wherein the output resistors are adjustable.

7. The apparatus of claim 1, wherein the plurality of driver circuits comprises a plurality of single-stage amplifier circuits having outputs configured to be coupled to the control terminals of respective ones of the semiconductor switches and further comprising a pre-driver circuit having an output coupled in common to control terminals of the amplifier circuits.

8. The apparatus of claim 7, wherein the amplifier circuits comprise respective push-pull amplifier circuits.

9. The apparatus of claim 8, wherein the push-pull circuits comprise respective totem-pole circuits.

10. The apparatus of claim 1, wherein the semiconductor switches comprise respective wide-bandgap semiconductor switches.

11. The apparatus of claim 10, wherein the wide-bandgap semiconductor switches comprise respective silicon carbide (SiC) metal oxide semiconductor field effect transistors (MOSFETs).

12. The apparatus of claim 1, wherein the plurality of driver circuits are configured to drive the parallel-connected semiconductor switches responsive to a switch state control signal commonly applied to respective control terminals of the driver circuits.

13. An apparatus comprising:
a plurality of parallel-connected wide-bandgap semiconductor switches; and
a plurality of totem-pole amplifier circuits comprising respective pairs of transistors coupled in series between power supply nodes and having respective outputs configured to be coupled to control terminals of respective ones of the semiconductor switches, the totem-pole amplifier circuits configured to operate responsive to a drive signal applied in common to respective control terminals of the transistors of the totem-pole amplifier circuits, wherein the amplifier circuits have respective different power supplies that align state transitions of the parallel-connected wide-bandgap semiconductor switches.

14. The apparatus of claim 13, further comprising respective output resistors coupling respective ones of the amplifier circuits to respective ones of the semiconductor switches.

15. The apparatus of claim 13, wherein the semiconductor switches comprise respective SiC MOSFETs.

16. An apparatus comprising:
a plurality of totem-pole circuits having respective different power supplies and configured to be coupled to control terminals of respective ones of a plurality of parallel-connected semiconductor switches, wherein control terminals of the totem-pole circuits are connected in common and wherein the different power supplies are operative to align state transitions of the parallel-connected semiconductor switches; and
a pre-driver circuit having an output coupled to the commonly-connected control terminals of the totem-pole circuits.

17. The apparatus of claim 16, further comprising respective output resistors coupling respective ones of the totem-pole circuits to respective ones of the semiconductor switches.

18. The apparatus of claim 16, further comprising the plurality of semiconductor switches.

\* \* \* \* \*

UNITED STATES PATENT AND TRADEMARK OFFICE
CERTIFICATE OF CORRECTION

PATENT NO. : 11,290,088 B2
APPLICATION NO. : 16/795261
DATED : March 29, 2022
INVENTOR(S) : Geraldo Nojima It is certified that error appears in the above-identified patent and that said Letters Patent is hereby corrected as shown below:

In the Drawings

Figure 1: Please note "Q9" should read -- Q1 --

Figure 3, and on the title page, the print figure: Please note "Q9" should read -- Q1 --

In the Specification

Column 3, Line 25: Please correct "$V_{a1} V_{b1}, V_{a2} V_{b2}, V_{a3} V_{b3}$" to read -- $V_{a1}/V_{b1}, V_{a2}/V_{b2}, V_{a3}/V_{b3}$ --

Signed and Sealed this
Thirty-first Day of May, 2022

*Katherine Kelly Vidal*

Katherine Kelly Vidal
*Director of the United States Patent and Trademark Office*